United States Patent [19]

Leupold et al.

[11] Patent Number: 5,428,334

[45] Date of Patent: Jun. 27, 1995

[54] FIELD AUGMENTED PERMANENT MAGNET STRUCTURES

[75] Inventors: Herbert A. Leupold, Eatontown; Anup Tilak, Bridgwater, both of N.J.

[73] Assignee: The United States of America as represented by the Secretary of the Army, Washington, D.C.

[21] Appl. No.: 322,652

[22] Filed: Oct. 11, 1994

Related U.S. Application Data

[60] Division of Ser. No. 996,281, Dec. 23, 1992, Pat. No. 5,382,936, which is a continuation-in-part of Ser. No. 892,093, Jun. 2, 1992, abandoned.

[51] Int. Cl.$^6$ .............................................. H01F 7/02
[52] U.S. Cl. ................................................... 335/306
[58] Field of Search ................................ 335/210–214, 335/284, 296–306; 315/5.34, 5.35; 324/318–320

[56] References Cited

U.S. PATENT DOCUMENTS

| | | | |
|---|---|---|---|
| 3,283,200 | 11/1966 | Pallakoff | 335/306 |
| 4,695,802 | 9/1987 | Zijlstra | 324/319 |
| 4,706,057 | 11/1987 | Schwab | 335/284 |
| 4,953,555 | 9/1990 | Leupold et al. | 128/653 A |
| 5,162,771 | 11/1992 | Abele | 335/306 |
| 5,278,534 | 1/1994 | Abele et al. | 335/306 |

*Primary Examiner*—Gerald P. Tolin
*Assistant Examiner*—Raymond B. Barrera
*Attorney, Agent, or Firm*—Michael Zelenka; James A. DiGiorgio

[57] ABSTRACT

A permanent magnet comprising a shell of magnetic material having a hollow cavity and an access port that passes through the shell and communicates with the cavity. The shell is permanently magnetized to produce a magnetic field in the cavity. A magnetic insert is located in the cavity. The insert has a tunnel aligned with the access port and is magnetized in a direction opposite to the direction of the magnetic field. Specifically, a spherical magnetic shell has a concentric cavity in which a spherical magnetic insert is housed. An access port in the form of an axial hole passes through the spherical center of the shell and the insert. The shell ("magic sphere") is magnetized such that it is capable of producing a uniform magnetic field in the cavity. The insert is uniformly magnetized in a direction opposite to that of the cavity field produced by the shell. As such a working field that has a strength greater than that of the cavity field produced by the shell is located in the tunnel. Another embodiment shows a cylindrical shell having an access port in the form of a narrow, gap that passes through the cylindrical shell ("magic ring") and a uniformly magnetized concentric insert. The insert augments the working field that is produced by the shell. An outer, uniformly magnetized shell that houses the structure may be tailored to cancel exterior dipole fields.

13 Claims, 4 Drawing Sheets

FIELD AUGMENTED PERMANENT MAGNET STRUCTURES

GOVERNMENT INTEREST

The invention described herein may be manufactured, used, and licensed by or for the Government for governmental purposes without the payment to me of any royalty thereon.

NOTICE OF CONTINUATION

This is a division of application Ser. No. 07/996,281, filed Dec. 23, 1992, now U.S. Pat. No. 5,382,936, which is a continuation-in-part of application Ser. No. 07/892,093, entitled FIELD AUGMENTATION IN HIGH-INTENSITY MAGNETIC FIELD SOURCES, by inventor Herbert A. Leupold, filed 2 Jun. 1992, now abandoned.

BACKGROUND OF THE INVENTION

1. Field of the Invention

The present invention relates to high-field permanent magnets. More specifically, it relates to structures and techniques for augmenting a working magnetic field contained in a cavity of a permanent magnet.

2. Description of the Prior Art

High-remanence, high-coercivity, permanent-magnet materials, such as those of the rare-earth type, have improved so that it is now practical to make flux sources of extraordinary strength and compaction. Examples of high-intensity, compact permanent magnets may be found in the following references:

Leupold, U.S. Pat. No. 4,835,506, entitled "Hollow Substantially Hemispherical Permanent Magnet High-Field Flux Source;"

Leupold, U.S. Pat. No. 4,837,542, entitled "Hollow Substantially Hemispherical Permanent Magnet High-Field Flux Source for Producing a Uniform High Field;"

Leupold, U.S. Pat. No. 4,839,059, entitled "Clad Magic Ring Wigglers;"

Leupold, U.S. Pat. No. 5,103,200, entitled "High-Field Permanent Magnet Flux Source;"

Leupold, U.S. Statutory Invention Registration H591, entitled "Method of Manufacturing of a Magic Ring;"

Leupold et al., "Novel High-Field Permanent-Magnet Flux Sources," *IEEE Transactions on Magnetics*, vol. MAG-23, No. 5, pp. 3628–3629, September 1987;

Leupold et al., "A Catalogue of Novel Permanent-Magnet Field Sources," *Paper No. W3.2, 9th International Workshop on Rare-Earth Magnets and Their Applications*, pp 109–123, August 1987, Bad Soden, FRG;

Leupold et al., "Design applications of magnetic mirrors," *Journal of Applied Physics*, 63(8), 15 Apr. 1988, pp. 3987–3988;

Leupold et al., "Applications of yokeless flux confinement," *Journal of Applied Physics*, 64(10), 15 Nov. 1988, pp. 5994– 5996; and Abele et al., "A general method for flux confinement in permanent-magnet structures," *Journal of Applied Physics*, 64(10), 15 Nov. 1988, pp. 5988–5990.

Additionally, magnets of the type described herein may be found in the following co-pending U.S. Pat. Applications that are incorporated herein by reference:

Ser. No. 654,476, filed 13 Feb. 1991, entitled "High-Power Electrical Machinery;"

Ser. No. 650,845, filed 5 Feb. 1991, entitled "High-Power Electrical Machinery with Toroidal Permanent Magnets;" and Ser. No. 892,104, filed concurrently herewith, entitled "Magnetic Field Sources Having Non-Distorting Access Ports," Docket No.: CECOM 4666.

These references show a number of high-intensity permanent magnets having a variety of different compact shapes. In general, the magnets described in these references have a shell of magnetic material and a cavity in which a working field is located. Access ports of various sizes, shapes and locations pass through the shell and communicate with the cavity.

Salient among these magnets are cylindrical ("magic ring") and spherical ("magic sphere") magnetic shells in which the direction of magnetization changes as a function of a polar angle. These magnets produce in their cavities uniform, polar-axial transverse fields. Theoretically, there is no limit to the fields attainable in a cavity of this type if one is willing to employ enough magnetic material of sufficiently high coercivity to retain its magnetism in the face of the high distorting fields engendered by the structure.

In practice, it is difficult to produce a spherical or cylindrical shell having a remanence or remanent magnetization the direction of which continuously varies. Consequently, such shells are typically constructed from segments that are each uniformly magnetized. When nested, the segments form a magnetic shell. In the case of a segmented cylindrical shell, the angular direction of magnetization changes abruptly by $4\pi/N$ between adjacent segments, where N is the number of nested segments.

A working field produced by a segmented shell suffers surprisingly little from the approximation by segmentation. For example, if a cylindrically shaped shell is divided into sixteen segments, it produces a magnetic field of over 97% of that produced by a continuous structure. Even with a coarse approximation of only eight segments, 90% of the ideal field is realized. Specifically, a segmented spherical shell having an outer radius of 3.3 centimeters that is made of a magnetic material having a remanence of ten kilogauss can produce a field of sixteen kilo-oersted in a spherical cavity having a radius of only 1.0 centimeter. The shell would have a mass of only 1.1 kilograms. Similar performance is obtainable from cylindrical and hemispherical structures.

Although such high-intensity, compact magnets have served the purpose, those concerned with their development have recognized the need for structures and techniques that further increase magnetic intensity without appreciably increasing size and mass. The present invention fulfills this need.

SUMMARY OF THE INVENTION

The general purpose of this invention is to provide a compact permanent-magnet flux source having a working field of very high intensity. To attain this, the present invention contemplates a unique field-enhancing insert of active (permanent magnet) or passive (iron) magnetic material that combines with a magnetic flux source to increase the intensity of the working magnetic field.

Sometimes, as in certain fiber-optic or electron-beam applications, a working field is needed only over a narrow region. However, in many magnet structures, the space available for the working field is relatively large. For example, in those flux sources that have a magnetic shell and a cavity, as described above, much of the cavity space is often not used: a narrow cylindrical region around a polar or equatorial axis in the center of the cavity is all that is usually needed for a working field. It is contemplated in the present invention that the unused or excess space in such structures be filled with a field-enhancing insert having active or passive magnetic properties so as to increase the intensity of the working field.

More specifically, the present invention includes a permanent magnet comprising a shell of magnetic material having a hollow cavity and an access port that passes through the shell and communicates with the cavity. The shell is permanently magnetized to produce a magnetic field in the cavity. A field-enhancing insert having a tunnel bore hole is located in the cavity such that the insert tunnel is aligned with the shell's access port. The field enhancing insert is permanently magnetized in a direction opposite to the direction of the cavity field if the access port and cavity are in-line with the polar axis of the shell (axial). The insert, however, is either a passive magnet (iron) or a permanent magnet magnetized in the same direction of the cavity field if the access port and cavity are perpendicular to the poles of the shell (equatorial).

According to another aspect of the invention, a spherical magnetic shell has a concentric cavity in which a spherical magnetic insert is housed. An access port in the form of an axial hole passes through the spherical center of the shell and the insert. The shell ("magic sphere") is magnetized such that it is capable of producing a uniform magnetic field in the cavity. The field-enhancing insert is uniformly magnetized in a direction opposite to that of the cavity field produced by the shell. As such a working field that has a strength greater than that of the cavity field produced by the shell is located in the axial hole.

According to still another aspect of the invention, the access port is a narrow, axial gap that passes through a cylindrical shell ("magic ring") and a uniformly magnetized concentric field-enhancing insert. The insert augments the working field that is produced by the shell. An outer, uniformly magnetized shell can house the structure to cancel exterior dipole fields.

According to yet another aspect of the invention, a "magic sphere" shell has a concentric cavity in which a spherical magnetic insert is housed. An access port in the form of an equatorial hole passes through the spherical center of the shell and the insert. The "magic sphere" shell is magnetized such that it is capable of producing a uniform magnetic field in the cavity. The field-enhancing insert is uniformly magnetized in the same direction as the cavity field produced by the shell. As such, the working field has a much greater strength than the cavity field alone.

According to still a further aspect of the invention, a "magic sphere" shell has a concentric cavity in which a passive magnet (iron) insert is housed. An access port in the form of an equatorial plane is passed through the spherical center of the shell to essentially separate the sphere into two half-spheres. The shell of each half-sphere is magnetized such that it is capable of producing a uniform magnetic field in the cavity and creating magnetic excitation in the insert. The excited passive magnet insert, in turn, augments that cavity field produced by the shell. Moreover, if the "magic sphere" shell is magnetized such that it saturates the passive magnet insert, the insert will create maximum magnetic field augmentation in the cavity.

According to yet another aspect of the invention, the magic sphere above having an access port passing through the spherical center of the shell, including the insert, in the form of a cylindrical tunnel rather than an equatorial plane. The shell is magnetized such that it saturates the insert because the insert can not augment the field otherwise.

According to still another aspect of the invention, the access port is a narrow, equatorial gap that passes through a "magic ring" shell and a uniformly magnetized concentric field-enhancing insert. Insertion of a passive or permanent magnet in the cavity augments the shell's working field. An outer, uniformly magnetized shell can house the structure to cancel exterior dipole fields.

The exact nature of this invention, as well as other objects and advantages thereof, will be readily apparent from consideration of the following specification relating to the annexed drawing.

DETAILED DESCRIPTION OF THE PREFERRED EMBODIMENTS

Figure 1:
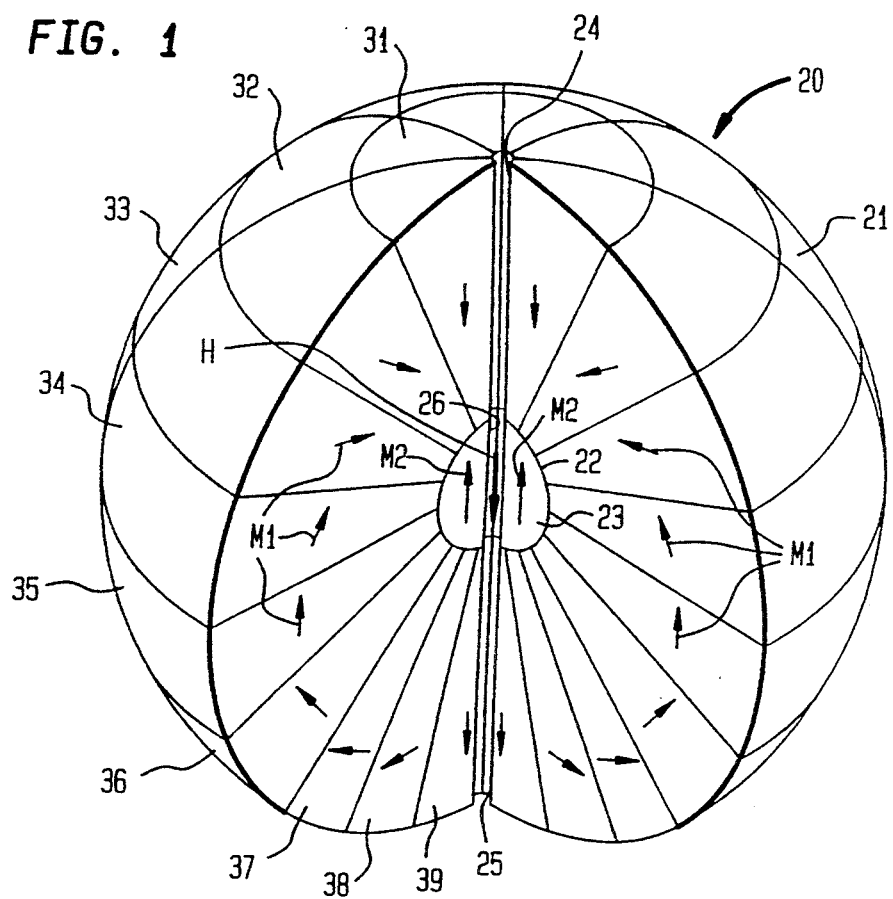
FIG. 1 is a pictorial view of a preferred embodiment of the invention showing an axial "magic-sphere" type magnet in cross section and with a ninety-degree section removed.

Referring now to the drawings, there is shown in FIG. 1 a high-field permanent magnet 20 having a spherical magnetic shell 21, a concentric spherical cavity 22, and a spherical magnet insert 23 located in cavity 22. Coaxial access ports 24 and 25 pass through shell 21 on opposite sides of cavity 22 along a polar axis. A tunnel 26, which passes through the spherical center of magnetic insert 23, is coaxially aligned with ports 24 and 25. Ports 24 and 25 and tunnel 26 form a narrow, cylindrical hole of sufficient size to permit proper utilization of a working field which is located in tunnel 26. Utilization of the working field in tunnel 26 would typically be by way of an optical fiber, an electron beam, a waveguide, etc.

Magnetic shell 21 is formed as a conventional segmented "magic-sphere" type magnet. Shell 21 comprises a series of nested cones 31–39 of equal angular extent, i.e. each cone subtends an angle of twenty degrees, and is centered about a vertical polar axis, where the longitudinal axis of ports 24 and 25 and tunnel 26 is the vertical polar axis. Considering cone 32, by way of example, it is readily seen to be a shell having inner and outer spherical surfaces and nesting conical surfaces that are spaced by twenty degrees and intersect at the spherical center.

While nine cones are depicted in FIG. 1, magnet 20 might comprise a fewer or larger number. Of course, the larger the number of cones, the closer magnet 20 approximates an ideal magnet of the type where the magnetization changes continuously. It is noted that shell 21 is composed of seventy-two segments. For clarity, a ninety-degree portion composed of eighteen segments is not shown in FIG. 1.

Cones 31–39 are segmented along equally spaced meridians. It can be seen that cones 31–39 are each comprised of eight similar segments (two segments of each cone are not shown). Although cones 31–39 are illustrated as being segmented into eight segments each, they may comprise a fewer or greater number of segments: the greater the number of segments, the closer shell 21 will approximate an ideal configuration.

The magnetization in each of the segments of cones 31–39 is uniform, i.e. constant in magnitude and direction. However, the magnetization from segment to segment varies in direction with the average polar angle of its cone. Arrows M1, which are shown in FIG. 1 on the faces of the segments, represents the direction and intensity of the magnetization for that particular segment.

As is well known in the art, shell 21 is capable of producing a high-intensity magnetic field of substantial uniformity in cavity 22. This field H is directed downwardly in a direction parallel to the vertical polar axis as viewed in FIG. 1. Specifically, the cavity field H of a "magic sphere" like shell 21 is:

$$H = 4/3[B_R \ln(r_o/r_i)] \quad (1)$$

where:
$B_R$ is the magnet remanence;
$r_o$ and $r_i$ are respectively the outer and inner radii of the "magic sphere;" and
H, the cavity field, is parallel to the polar axis.

Field H is augmented in accordance with the present invention by introduction of the spherical magnetic insert 23. Insert 23 is magnetized uniformly as indicated by arrow M2 in FIG. 1. The uniform magnetization of insert 23 is directed opposite to the direction of magnetic field H. Essentially, insert 23 asserts a demagnetization field in the excess regions of cavity 22 such that the working field in tunnel 26 will be increased by substantially $B_s/3$, where $B_s$ is the remanence of insert 23 and ⅓ is the demagnetization coefficient of a solid sphere.

To illustrate the degree of field augmentation that is possible, assume that shell 21 has an outer radius $r_o$ of 3.3 cm and that both shell 21 and insert 23 are made of the same high-remanence material, such as Nd—Fe—B which has a magnetic remanence in excess of ten kilogauss. In this case, with a ratio of outer radius to inner radius ($r_o/r_i$) equal to 3.32 for shell 21, a cavity field H of about 16.0 kilo-oerstead is produced by shell 21. Cavity field H is downwardly directed parallel to the vertical polar axis as viewed in FIG. 1. A working magnetic field of 19.3 kilo-oerstead will be produced in tunnel 26. This represents a 17% increase in the size of the working field at a cost of 4.0 cm³ (2.7%) increase in material volume represented by the addition of insert 23. To obtain the same size working field without insert 23, i.e. by making shell 21 thicker, the cost is a 168 cm³ (112%) increase in material volume and mass of shell 21. This technique offers an even greater field gain when applied to a cylinder ("magic ring") because of its larger demagnetization coefficient of ½.

Figure 2:
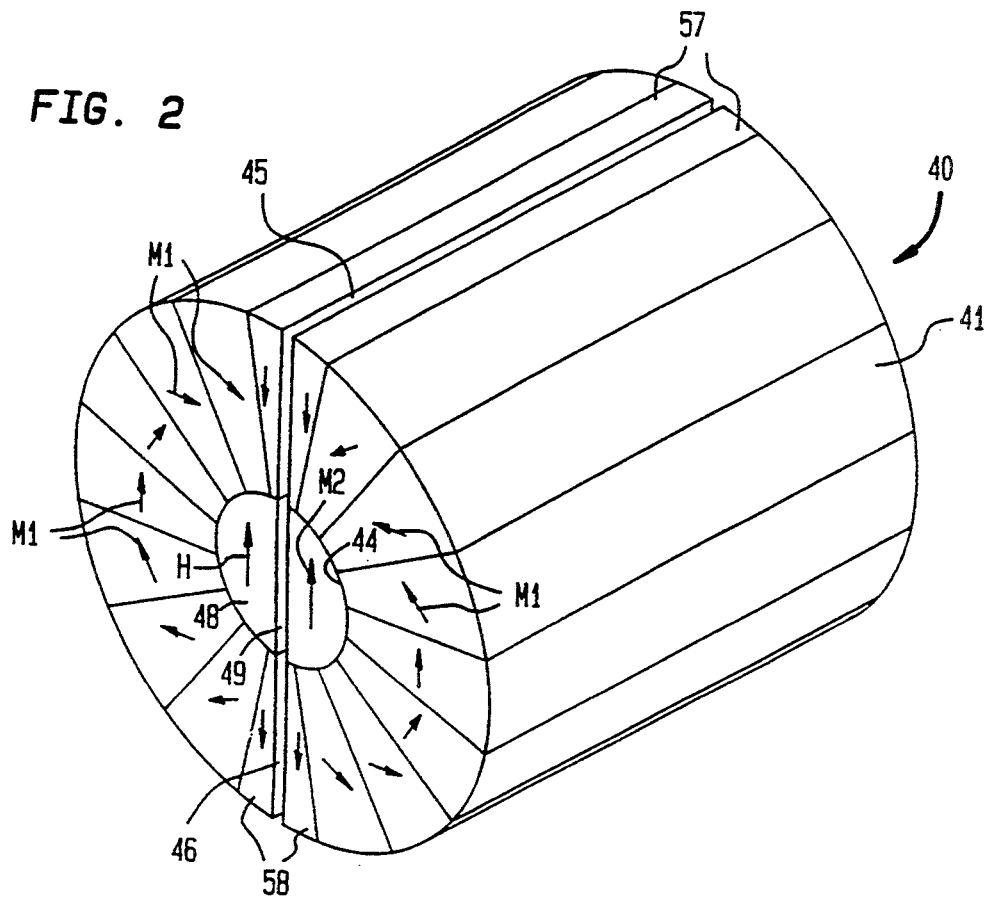
FIG. 2 is a pictorial view of another embodiment of the invention showing an axial "magic-ring" type magnet.

FIG. 2 illustrates a segmented, cylindrical magnet 40 shaped as a "magic ring." Magnet 40 has a plurality of segments that are nested to form a cylindrical shell 41 with a concentric cylindrical cavity 44. Disregarding co-planar access ports 45 and 46, the segments are all similarly shaped. Also, each segment is uniformly magnetized M1 in a plane perpendicular to the cylindrical axis of magnet 40. From segment to segment, the variation in the direction of magnetization M1 is twice that of a polar angle where the cylindrical axis and the polar axis pass through the center of ports 45 and 46. Cavity field H, a substantially uniform magnetic field, is the result of shell 41.

A cylindrical magnetic insert 48, composed of two spaced half-cylinders, is located in cavity 44. Insert 48 has a narrow, planar tunnel 49 that is aligned with the ports 45 and 46. Access ports 45 and 46 are narrow, co-planar gaps that lie in the plane of the longitudinal axis of cylindrical magnet 40. Ports 45 and 46 pass through the center of opposed split segments 57 and 58. The plane of access ports 45 and 46 is aligned parallel to cavity field H. Magnetization M2 of insert 48 is directed opposite to that of cavity field H. The working field, which is the sum of the combined effects of shell 41 and insert 48, is located in tunnel 49 and is directed in the same direction as cavity field H.

In addition to the augmentation of the working field produced by inserts 23 and 48, there is also an augmentation of the external dipole field due to the large dipole moments of these inserts. In those cases where flux confinement is important, substantially all external dipolar fields can be canceled by an oppositely directed dipole field via the addition of a uniformly magnetized outer shell.

Figure 3:
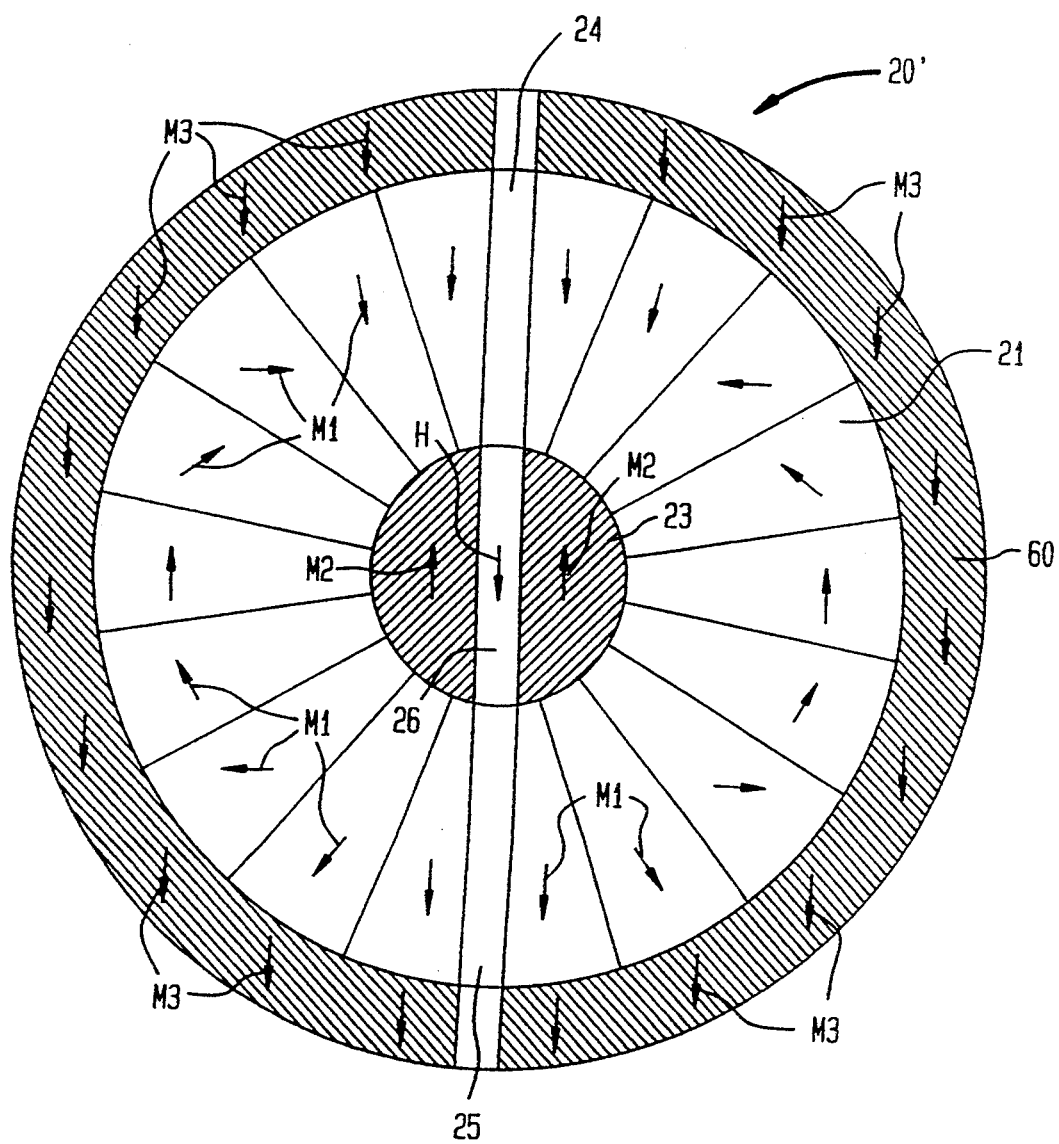
FIG. 3 is a sectional elevation view of an alternate embodiment of the device shown in FIG. 1.

FIG. 3 illustrates a spherical magnet 20' that is composed of spherical shell 21 and insert 23 of FIG. 1, plus a uniformly magnetized outer shell 60 that surrounds inner shell 21. Shell 60, being uniformly magnetized, has no interior field and, therefore, has no effect on the working field in tunnel 26. Shell 60 is uniformly magnetized M3 in a direction opposite to magnetization M2. As such, shell 60 produces an exterior dipole field that is opposite to the external dipole field produced by insert 23. The intensity of the external dipole field of shell 60 may be readily tailored by those skilled in the art so as to cancel out the external field produced by insert 23.

Moreover, the shape and direction of an access hole, bore through the concentric shells to the cavity, can be adjusted by adding additional uniformly magnetized shells having a predetermined polarity and direction with respect to the inner shell. The direction and magnitude of any additional uniformly magnetized shell may be readily determined by those skilled in the art so as to provide the ability to bore an access hole of a desired shape and direction while preserving the cavity flux and the negate the external field.

Figure 4:
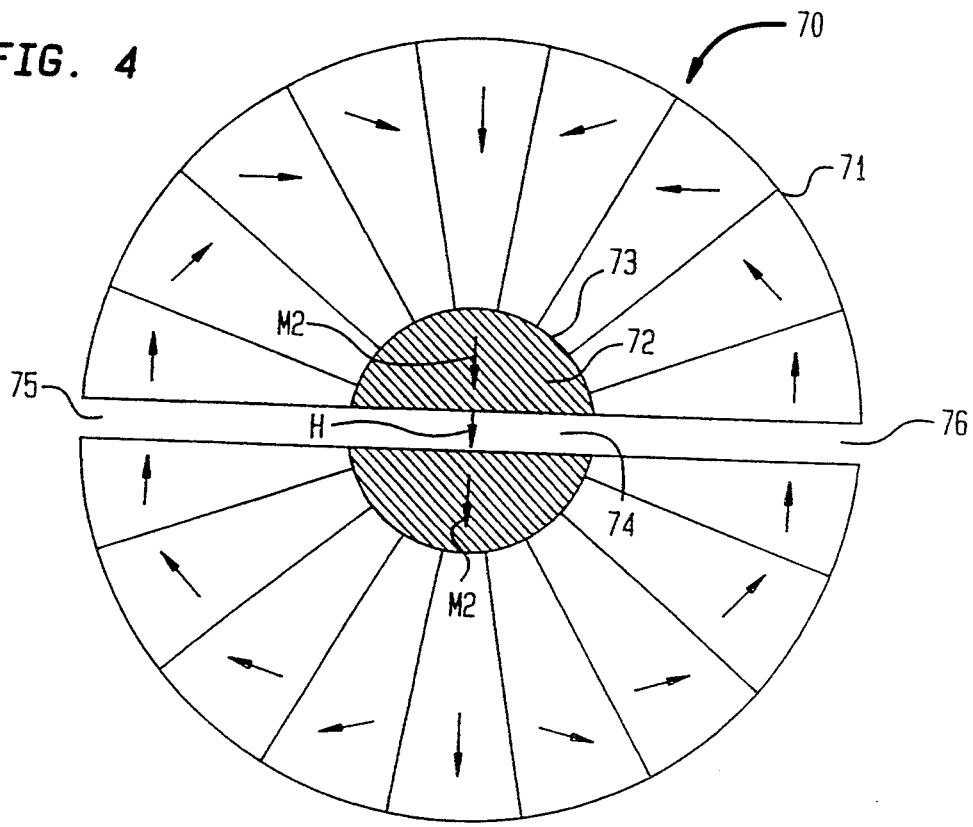
FIG. 4 is a cross sectional view of another embodiment of the invention showing half of an equatorial "magic sphere" type magnet having a planar hole bisecting the sphere into two half-spheres and an active magnet insert.

FIG. 4 illustrates an equatorial spherical magnet 70 that is composed of spherical shell 71 having a concentric cavity 73 and a spherical magnet insert 72 located in cavity 73. Coequatorial access ports 75 and 76 pass through shell 71 on opposite sides of cavity 73 perpendicular to the polar axis of the shell. A tunnel 74, which passes through the spherical center of insert 72, is aligned with access ports 75 and 76. Ports 75 and 76 and tunnel 74 form a narrow, cylindrical hole of sufficient size to permit proper utilization of a working field which is located in tunnel 74. Magnetization M2 of insert 72 is directed in line with that of cavity field H. As such, the working field is the sum of the combined effects of shell 71 an insert Magnetization M2.

The working field of spherical magnet 70 may be enhanced even greater by using a passive magnet (not shown), such as iron, as insert 72. Passive magnets such as iron have magnetic properties for enhancing a working field in an equatorial structure. Even though a passive magnet does not create a magnetic field itself, it behaves as if it does create a field when placed in the presence of another field because its differential permeability is equal to one. For optimum enhancement, however, a passive insert 72 must be saturated by shell 71. In fact, when shell 71 is magnetized such that it saturates the iron insert, the working field will be enhanced almost twice a much as with a permanent magnet insert. This quality is due to iron having almost twice as much remanence as a permanent magnet.

Although enhancement will be significantly reduced, a nonsaturated passive insert can still enhance the working field of a magic sphere having a planar hole passing through the cavity bisecting the insert and sphere into two half-spheres. As such, the embodiment of FIG. 4 may be modified to have a passive magnet insert instead of insert 72.

As in the spherical magnet of FIG. 1, all external dipole fields caused by insert 72 can be canceled by the addition of uniformly magnetized outer shells (not shown in FIG. 4).

Figure 5:
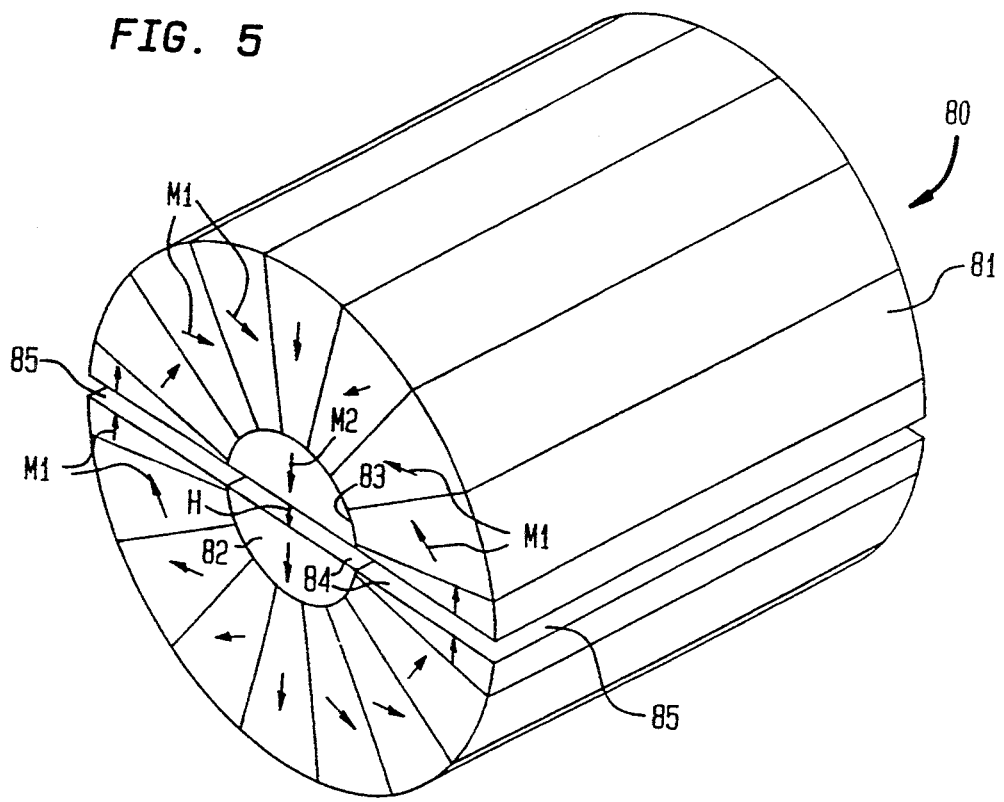
FIG. 5 is a pictorial view of yet another embodiment of the invention showing an equatorial "magic ring" type magnet with an active magnet insert.

FIG. 5 illustrates an equatorial "magic ring" 80 that is composed of cylindrical shell 81 having a concentric cavity 83 and insert 82. Insert 82 is a magnetic material having a narrow, planar tunnel 84 that is aligned with ports 85 and 86 to form a plane perpendicular to cavity field H. Magnetization M2 of insert 82 is directed in the same direction as that of cavity field H. Cavity field H is sum of the combined effects of shell 81 and insert 82.

Figure 6:
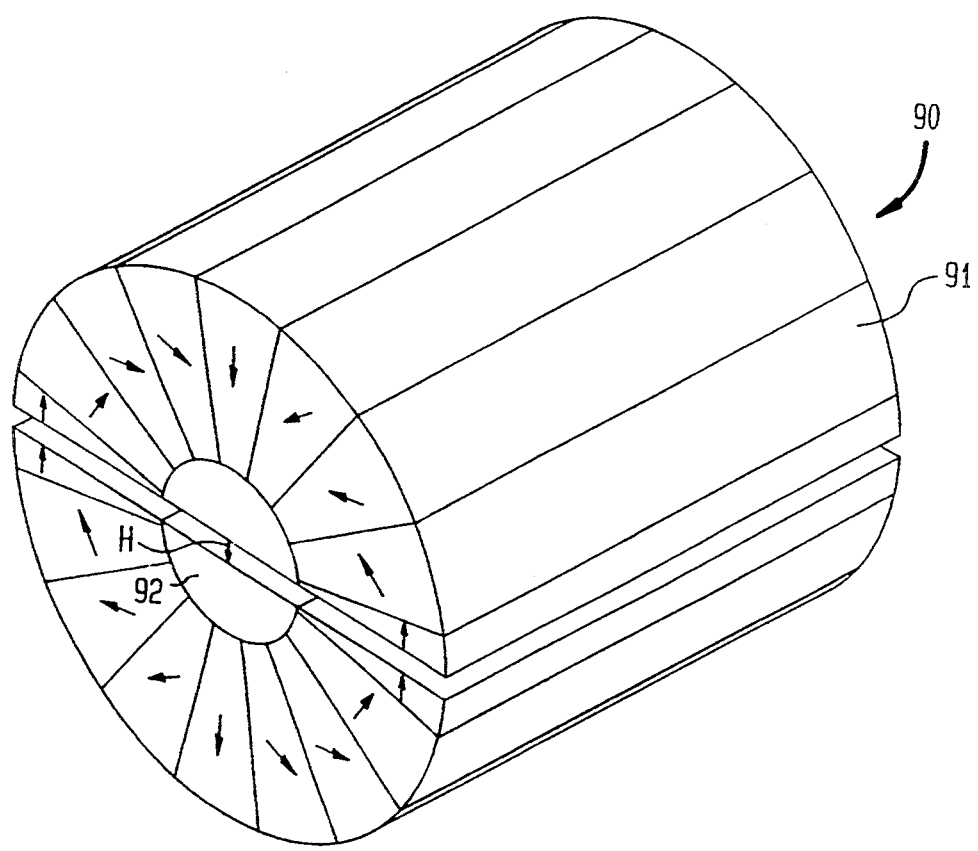
FIG. 6 is a pictorial view of an alternate embodiment of the device shown in FIG. 5 showing an equatorial "magic ring" with a passive (iron) magnet insert.

FIG. 6 illustrates an equatorial cylindrical magnet 90 having the same properties as that disclosed in FIG. 5, above, except that insert 92 is a passive magnet (i.e.: iron) rather than a permanent magnet. Depending on the cavity field strength H created by shell 91, passive insert 92 may enhance cavity field H even greater than a permanent magnet insert of similar size. This is due to the fact that a passive insert has a differential permeability equal to one and twice the remanence of a permanent magnet insert. Consequently, passive insert 92 must be saturated by shell 91 to provide optimum enhancement of cavity field H. If insert 92 is not saturated, the cavity field will still be enhanced but at a significantly reduced level.

Obviously many other modifications and variations of the present invention are possible in the light of the above teachings. For example, the inventive technique may be readily applied to a variety of other magnetic flux sources. Those skilled in the art will find it obvious, in the light of the above teachings, to employ this technique when designing toroidal magnets or hemispherical magnets. Further, this technique may be readily applied to cavities in magnetic structures of other than spherical or cylindrical shape. In such cases, however, the working field would vary in strength along the structural axis. This would be useful for applications where field strength is all important and uniformity is not important, e.g. in some Faraday rotators. It is therefore to be understood, that within the scope of the appended claims, the invention may be practiced otherwise than as specifically described.

What is claimed is:

1. A permanent magnet structure with an augmented magnetic field comprising:
   a shell of magnetic material having a hollow cavity and an access port that passes through said shell and communicates with said cavity, said shell being permanently magnetized to produce a field in said cavity such that said field points in a direction perpendicular to said access port communication through said cavity; and
   a permanent magnet insert located in said cavity having a narrow planar tunnel aligned with said access port, said insert magnetized to work in conjunction with said shell to enhance said cavity field.

2. The structure of claim 1 wherein at least a portion of said shell is spherical.

3. The structure of claim 2 wherein said shell, said cavity and said insert are concentric spheres having a spherical center and a polar axis that passes through said center perpendicular to said tunnel.

4. The structure of claim 3 wherein said access port and said tunnel form a narrow cylindrical hole that passes through said structure perpendicular to said polar axis.

5. The structure of claim 4 wherein said shell comprises a plurality of magnetic segments and wherein each said segment is uniformly magnetized.

6. The structure of claim 5 wherein said shell is magnetized with a uniform magnitude and an orientation that varies as a function of an average polar angle of said segments.

7. The structure of claim 6 further comprising an outer shell of magnetic material being uniformly magnetized in a direction opposite to the magnetization of said insert so that exterior fields created by said insert are cancelled without affecting the cavity field.

8. The structure of claim 1 wherein at least a portion of said shell is cylindrical.

9. The structure of claim 8 wherein said shell, said cavity and said insert are concentric circular cylinders having a cylindrical axis and a polar axis that passes through said cylindrical axis perpendicular to said tunnel.

10. The structure of claim 9 wherein said access port and said tunnel lie in a plane perpendicular to said polar axis and said cylindrical axis.

11. The structure of claim 10 wherein said shell comprises a plurality of magnetic segments and wherein each said segment is uniformly magnetized.

12. The magnet of claim 11 wherein said shell is magnetized with a uniform magnitude and an orientation that varies as a function of an average polar angle of said segments.

13. The structure of claim 12 further comprising an outer shell of magnetic material being uniformly magnetized in a direction opposite to the magnetization of said insert so that exterior fields created by said insert are cancelled without affecting the cavity field.

* * * * *